US006839391B2

(12) United States Patent
Novak et al.

(10) Patent No.: US 6,839,391 B2
(45) Date of Patent: Jan. 4, 2005

(54) METHOD AND APPARATUS FOR A REDUNDANT CLOCK

(75) Inventors: Peter David Novak, Keller, TX (US); Angela Carol McCrory, North Richland Hills, TX (US); Dale Emerson Ray, Fort Worth, TX (US); Toni Ann Long, Arlington, TX (US)

(73) Assignee: Motorola, Inc., Schaumburg, IL (US)

( * ) Notice: Subject to any disclaimer, the term of this patent is extended or adjusted under 35 U.S.C. 154(b) by 258 days.

(21) Appl. No.: 10/041,338

(22) Filed: Jan. 8, 2002

(65) Prior Publication Data

US 2003/0128782 A1 Jul. 10, 2003

(51) Int. Cl.[7] .......................... H04L 7/00; H03K 17/00
(52) U.S. Cl. ...................................... 375/354; 327/99
(58) Field of Search ........................ 375/260, 354–356; 327/147–151; 370/228

(56) References Cited

U.S. PATENT DOCUMENTS

| | | | | |
|---|---|---|---|---|
| 4,282,493 A | * | 8/1981 | Moreau | 331/2 |
| 4,779,008 A | * | 10/1988 | Kessels | 327/147 |
| 5,065,454 A | * | 11/1991 | Binz et al. | 398/154 |
| 5,448,597 A | * | 9/1995 | Hashimoto | 375/354 |
| 5,502,409 A | * | 3/1996 | Schnizlein et al. | 327/99 |
| 5,548,620 A | * | 8/1996 | Rogers | 375/354 |
| 5,648,964 A | * | 7/1997 | Inagaki et al. | 370/228 |
| 5,828,678 A | | 10/1998 | Mock | 371/62 |
| 5,881,113 A | * | 3/1999 | Lee | 375/354 |
| 6,078,225 A | * | 6/2000 | Bontekoe et al. | 331/14 |
| 6,107,855 A | * | 8/2000 | Wilcox | 327/295 |
| 6,194,939 B1 | * | 2/2001 | Omas | 327/298 |
| 6,239,626 B1 | * | 5/2001 | Chesavage | 327/99 |
| 6,256,360 B1 | * | 7/2001 | Wilhelmsson et al. | 375/354 |
| 6,339,625 B1 | * | 1/2002 | Tsuchiya | 375/354 |
| 2002/0027966 A1 | | 3/2002 | Fukuhara | 375/376 |
| 2002/0080825 A1 | * | 6/2002 | Wolf et al. | 370/517 |
| 2002/0082790 A1 | * | 6/2002 | Wolf et al. | 702/106 |

FOREIGN PATENT DOCUMENTS

JP    2001-352241    12/2001    ............. H03L/7/14

* cited by examiner

*Primary Examiner*—Stephen Chin
*Assistant Examiner*—Lawrence B. Williams

(57) ABSTRACT

A redundant clock system and communications cards for utilizing the system, the system including a clock source for providing a reference signal for communication cards; an alternate clock source, coupled to the clock source, for providing an alternate reference signal for the communication cards; each of the communication cards including a clock generator, referenced to one of the reference signals for providing clock signals at frequencies corresponding to functions provided by each of the communications cards, and each of the communication cards arranged to couple to a surviving one of the reference signals when a failure of the other is detected.

26 Claims, 4 Drawing Sheets

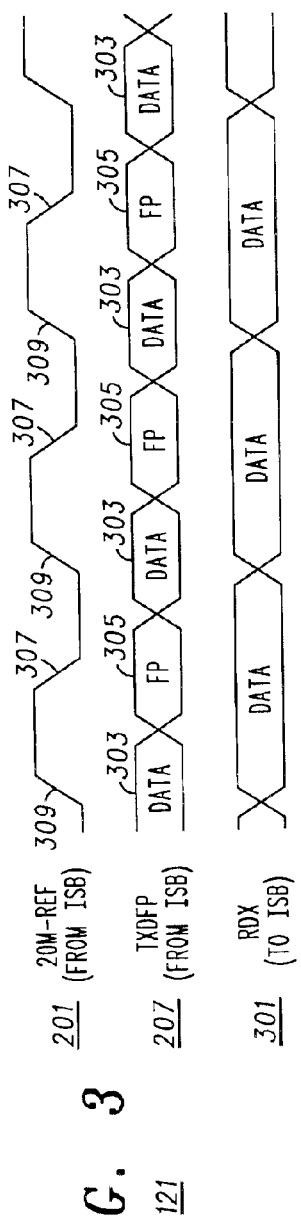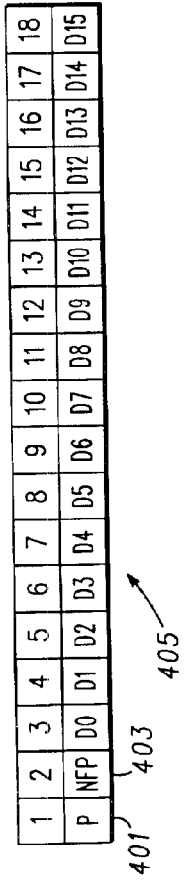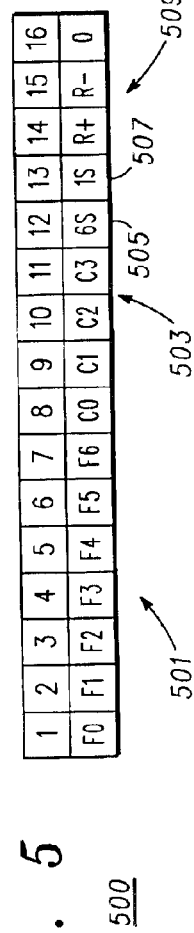
FIG. 3 121
FIG. 4 400
FIG. 5 500

US 6,839,391 B2

METHOD AND APPARATUS FOR A REDUNDANT CLOCK

FIELD OF THE INVENTION

This invention relates in general to communication systems, and more specifically to a method and apparatus for providing and using a redundant clock within constituent elements of such systems.

BACKGROUND OF THE INVENTION

Base stations for communications systems are known. Because the base station is so central to proper performance of the systems, carriers or system operators or providers of communication services have demanded that these base stations demonstrate a high level of availability. Thus many of the critical features or functions within these stations, such as central processors or switches and timing references or clocks are often redundant. Base stations having redundant capabilities such as a central clock or reference usually include the ability to switch over to the redundant clock or function.

In complex base stations having a multiplicity of communication resources or cards, such as radio frequency transceiver cards and base band processing cards, some or all repeated for each radio channel that is part of the base station, distribution of a redundant clock and particularly switching from one to another clock has proven to be a significant technical problem especially where the respective cards need to maintain synchronization or phase alignment.

In addition, the present marketplace demands base stations that are suited to handle different types of systems, for example, analog and CDMA spread spectrum systems or generally legacy systems and presently being deployed systems. It is often difficult to design communication cards or resources that efficiently operate off a single clock signal for the different systems.

What is needed is a method and apparatus for a redundant clock that addresses concerns such as these and others that will become more evident from the discussions below.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 3 illustrates in a respresentative form, a portion of a preferred embodiment of a reference signal for use in the FIG. 1 system in accordance with the present invention;

FIG. 4 demonstrates data field bit assignments in the FIG. 3 signal;

FIG. 5 demonstrates sync field bit assignments in the FIG. 3 signal;

DETAILED DESCRIPTION OF PREFERRED EMBODIMENTS

Figure 1:
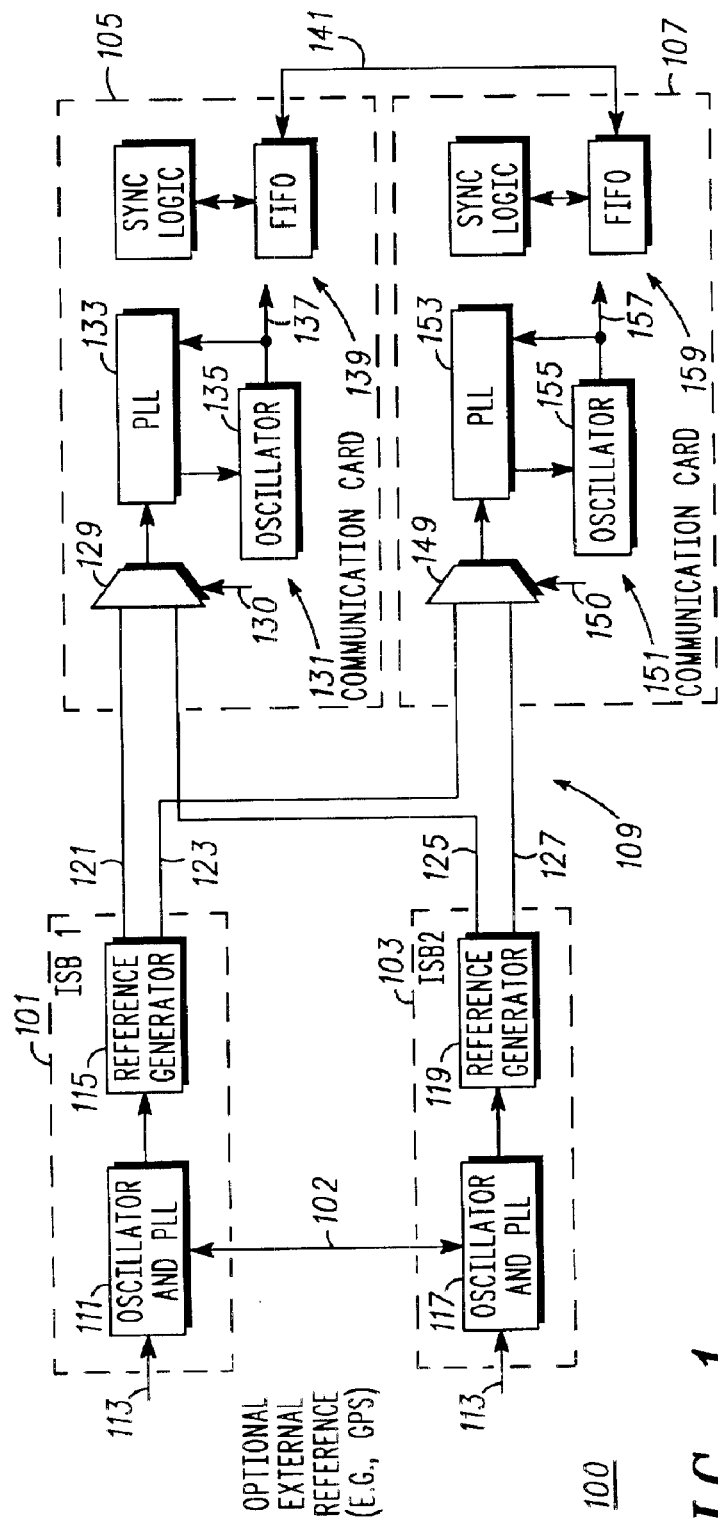
FIG. 1 depicts, in a simplified and representative form, a block diagram of a preferred embodiment of a redundant clock system coupled to communications cards according to the present invention.

In overview form the present disclosure concerns communications systems and more particularly equipment within such systems that utilize redundant systems, such as redundant clock systems to insure high availability service to communications units or more specifically users thereof operating therein. More particularly various inventive concepts and principles embodied in methods and apparatus for providing, using, and managing redundant reference signals within infrastructure equipment such as base stations or base sites are discussed. The communications systems of particular interest are IS-95 (CDMA), GSM, GPRS, etc. and those being planned, developed, or deployed such as Enhance Data rate GSM Evolution (EDGE) systems, wide band CDMA or UMTS, 3G, or the like. In the current marketplace one base site or station, due to economic considerations if nothing else, may need to provide service with or over a plurality of these air interfaces. For example, if a carrier or service provider has a legacy system and is in the process of deploying next generation systems the carrier may be interested in one base site or station handling the legacy systems and new systems.

As further discussed below various inventive principles and combinations thereof are advantageously employed to essentially decouple redundant reference signals and local clock signals provided these principles or equivalents thereof are utilized. Doing so has been shown to alleviate various problems associated with known systems where typically the clock signal is distributed directly from multiple sources to the clock users, such as communication cards or resources or payloads that are forced to deal with switching from one clock to another and the resultant transients while still maintaining synchronization with or between groups of cards. Historically significant effort and costs have been associated with and devoted to addressing such concerns with marginal success at best. Using the concepts and principles discussed herein allow different cards to have different local clocks more suited to their respective tasks and still maintain synchronization with the balance of the resources or cards when required within a base station.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, alternate, another, other and the like are used solely to distinguish one from another entity or action without necessarily requiring or implying any actual such relationship or order between such entities or actions. Much of the inventive functionality and many of the inventive principles are best implemented with or in software programs or instructions. It is expected that one of ordinary skill, notwithstanding possibly significant effort and many design choices motivated by, for example, available time, current technology, and economic considerations, when guided by the concepts and principles disclosed herein will be readily capable of generating such software instructions and programs with minimal experimentation. Furthermore the preferred embodiment for much of the logic and other hardware based functionality is semi-custom integrated circuits, such as programmable logic arrays, packaged as Field Programmable Gate Arrays (FPGA). Again one of ordinary skill notwithstanding significant efforts and design choices would not be unduly challenged to implement such hardware. Therefore further discussion of such software and hardware, if any, will be limited in the interest of brevity and minimization of any risk of obscuring the principles and concepts in accordance with the present invention.

FIG. 1 depicts, in a simplified form, a block diagram of a preferred embodiment of a redundant clock or reference system coupled to communications cards or resources according to the present invention. It is expected that a discussion of FIG. 1 will help provide some common language as well as familiarize the reader with some of the problems and limitations of present redundant clock systems and some of the opportunities and advantages envisioned and enabled by the principles and concepts according to the present invention. While the principles and concepts discussed here are expected to have broad application our discussions will be largely directed to an application within a base station, preferably for use in a cellular or cellular like wireless communications system.

These base stations as noted above can be very complex with many systems and subsystems, some devoted to establishing and maintaining wireless communications links while others are deployed for testing and diagnostics, wire line communications, traffic statistics, billing information, switching, and so on. For a base site to support a communications link may require two or more cards or resources or payloads. For a station or site to support wireless communications links on different technologies almost certainly will require different cards or payloads. A typical station will have tens of these payload cards or resources, some that will need to be synchronized with others. With this context our attention will now be directed to the exemplary redundant clock or reference signal scheme as depicted in FIG. 1.

FIG. 1 shows in a simplified form a redundant clock system 100 for use in communications equipment such as base sites or stations. The clock system includes a clock or reference source 101 for providing a reference signal at an interface 109, specifically at 121 and 123 for a plurality of communication cards, such as communications cards 105, 107 and an alternate clock or reference source 103, coupled to the reference source 101 at 102 as depicted, for providing an alternate reference signal at the interface 109, specifically at 125 and 127 for the plurality of communication cards 105, 107. Note that in the preferred form the reference and alternate reference signals are provided via a point to point connection such that the communications cards not shown will necessitate additional links such as 121, 125, 123, 127. Preferably these reference signals include a 20 MHz signal that will be detailed below. The reference signals are redundant, meaning identical and synchronized to a very close extent (less than 80 nano seconds in a preferred form). In a preferred form these reference and alternate reference sources (collectively referred to as reference sources) are part of a first and second interface and switching board (ISB). Each reference source includes an oscillator and phase locked loop (PLL) 111, 117. The oscillator is known technology and preferably a high stability 10 MHz ovenized oscillator or oscillator operating at 10 MHz in a temperature controlled environment together with a PLL using known techniques to provide a 20 MHz signal to a reference generation function 115, 119.

The oscillator may be coupled to an external reference such as a Global Positioning System (GPS) signal or UTC signal 113. The oscillators are synchronized via the signal at 102 which is derived from the output of a counter that generates a pulse once per second and this pulse may be used by the alternate reference source to drive a counter or other register to a known state as is known thus synchronizing the oscillators 111, 117 once every second. The reference generation 115, 119 is provided various data from other locations or sources, such as central processors, wire line transceivers, and the like (not shown) as known within the base station and operates to provide or generate as well as receive the reference signals (signal structure and content discussed below while referring to FIGS. 3–7) as well as buffer the respective signals and assure isolation between these signals so that a failure of the interface 109 at one point to point connection, such as 121, due for example, to a failure of a connector or back plane of a card cage, will not effect another such as 123.

Each of the plurality of communication cards 105, 107 is coupled to the reference signal and the alternate reference signal, as depicted, but at any one time selectively coupled to one of the reference signals by a multiplexer or switch 129, 149, respectively. Each of the plurality of communication cards 105, 107 includes a clock generator 131, 151, respectively, that is selectively coupled to or referenced to, via control inputs 130, 150, one of the reference signal and the redundant reference signal. The clock generator includes a PLL 133, 153 with an oscillator 135, 155 or voltage controlled oscillator (VCO), respectively, and is for providing one or more clock signals 137, 157 at frequencies corresponding to functions provided by each of the plurality of the communications cards. These frequencies may vary from 1 MHz to over 60 MHz depending on the communications card and its particular functions or requirements as well as the proper oscillator, VCO. The net result is that the clock generator or local board clock, specifically clock signals 137, 157 maintain a known phase relationship or are synchronized to the reference signals at 121, 125, 123, 127 which ever is selected by the switches 129, 149. The local or board clock or clock generator is thus controlled or guided or steered by the reference signal rather than being the reference signal and is thus somewhat independent from the reference signal. This is advantageous as the clock generator can free run continuing to provide the clock signals for short periods of time sufficient to effect a switch over to the redundant reference signal when a failure of the present or current reference signal occurs.

Each of the plurality of communication cards is arranged to couple to a surviving one of the reference signal or the redundant reference signal when a failure of the one which is presently coupled to the clock generator is detected. Although not required, in practice one of the reference sources, for example 101 will be the master reference source while 103 is the alternate and all communication cards will be coupled to the master reference source until a failure is detected. When a failure occurs it is every card or resource for itself and each card that has experienced a failure switches under hardware, at the card, control to the backup or redundant reference oscillator at that card. A central processor under software control will later be tasked with assuring that all cards again operate from the master reference signal once the indicated failure has been resolved. Thus another advantage of the present inventive redundant reference or clock system is that different communications cards can operate from different reference signals and switch to alternate reference signals at different times and still maintain synchronization with each other sufficient to carry on the tasks that each card is charged with as well as interoperate as needed.

Further included in the communications cards 105, 107 is synchronization logic and a circular FIFO buffer 139, 159. This logic and the circular FIFO buffer, preferably a 240 nanosecond buffer, allows cards that must remain synchronized, such as a transceiver card and a base band processing card or a test and diagnostic card, to do so over the base band bus 141. As further discussed below the logic utilizes a derivative signal or phase reference from the reference signal or selected reference signal to include a synchronization signal within the inter communications card signal and the 240 nano-second circular FIFO buffer is sufficient to accommodate worst case out of synch conditions that may occur when a reference signal failure is detected and a reference signal switch over occurs. This permits a receiving communications card to synchronize or realign local data with data received from other communications cards.

Figure 2:
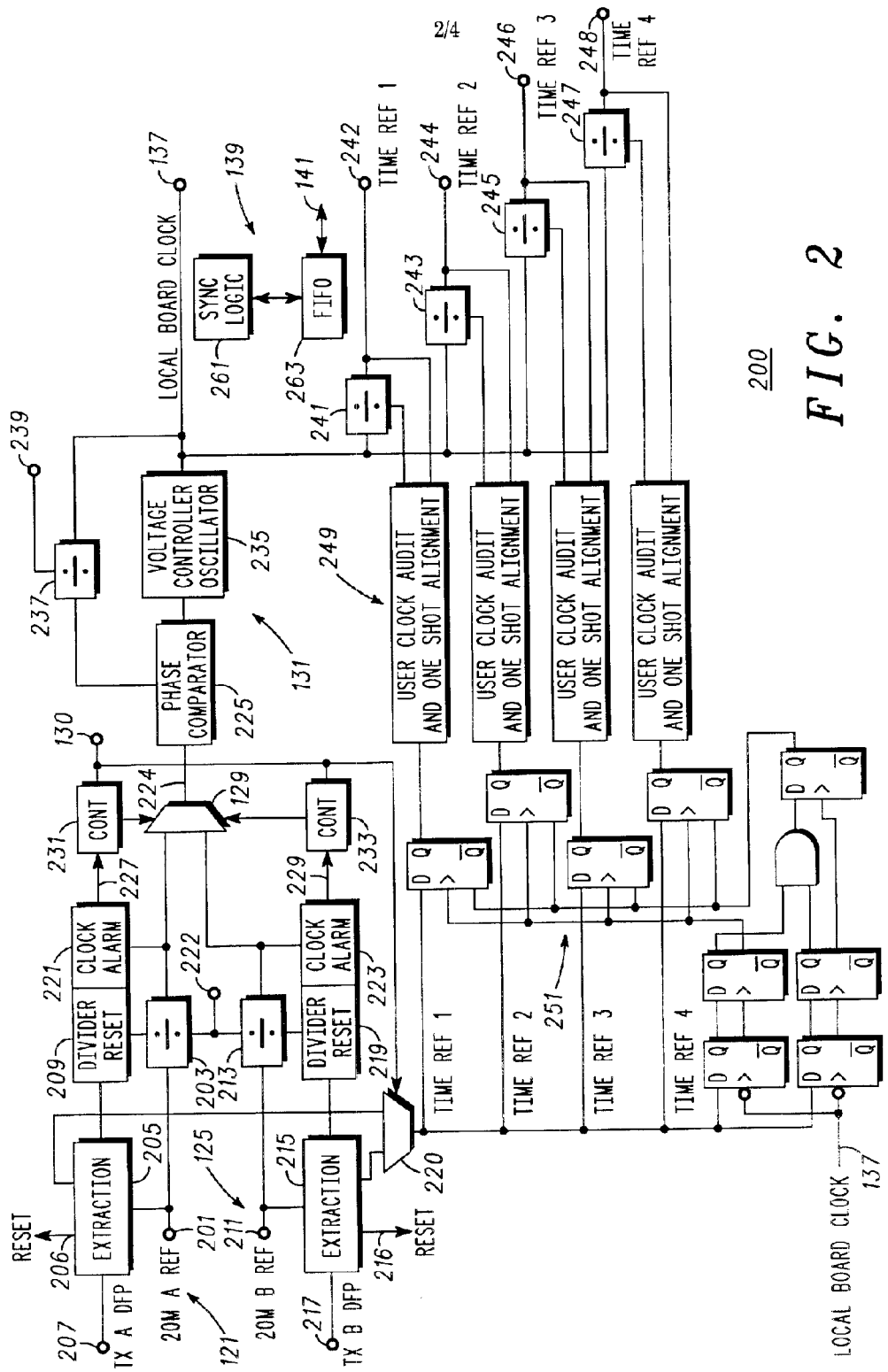
FIG. 2 depicts a block diagram of a preferred embodiment of a portion of the communication cards of FIG. 1 according to the present invention.

FIG. 2 depicts a more detailed block diagram of a preferred embodiment of a portion of the communication cards of FIG. 1. Depicted is a communications card 200, specifically relevant portion thereof, which is arranged and constructed to use a redundant reference clock system. The card includes means for coupling to a reference signal 121 and means for coupling to an alternate reference signal 125 each as noted above available from and as a part of the interface 109. The reference signal 121 includes a 20 MHz reference waveform at 201 that is coupled to an input divider 203 and a clock input of extraction logic 205. The alternate reference signal similarly includes a 20 MHz reference waveform at 211, identical to the reference waveform noted above, that is coupled to input divider 213 and a clock input of alternate extraction logic 215. The reference signal 121 further includes a, preferably, 20 MHz data frame pulse signal (40 Mega bit rate) 207 that is coupled to the extraction logic 205 and that corresponds to the reference waveform 201. The alternate reference signal 125 further includes a, preferably 20 MHz, alternate data frame pulse signal (40 Mega bit rate) 217 that is coupled to extraction logic 215 and that corresponds to the alternate reference waveform 211.

The data frame pulse signal and alternate data frame pulse signal are exact duplicates when everything is functioning properly and the two signals are closely synchronized with each other and there respective corresponding reference waveforms. As further discussed below the data frame pulse signal and the alternate data frame pulse signal are suitable for maintaining phase alignment of the reference signal and the alternate reference signal with, respectively, the frame pulse signal and the alternate frame pulse signal. The data frame pulse signals include data and a frame pulse signal that are intermixed with each other to form the data frame pulse signal. In a preferred form this data signal is circuit switched data for legacy circuit switched cellular phone systems. If the particular communications card or resource or payload does not need this data it is either not included on the point to point link or if included it is ignored. The frame pulse signal includes, as will be further detailed below, a reference phase or timing reference or information, additional time references, and a reset signal.

The extraction logic 205, 215 recovers the frame pulse signal from the data frame pulse signal, specifically including a synch field or frame and more specifically the reference phase from the frame pulse signal and this is forwarded to divider reset logic 209, 219 and used by the logic to force the, respective input divider to a known value once every 125 micro seconds or multiple thereof. This provides or insures proper phase alignment of the reference signal by removing any transient pulses that may have been received or induced into the reference signal in the path or interface 109 from the clock or reference source 101 to the communications card 200. Thus the extraction logic 205 recovers a reference phase from the frame pulse signal. Similarly the alternate extraction logic 215 recovers an alternate reference phase from the alternate frame pulse signal. This alternate reference phase is coupled to divider reset logic 219 and used to set input divider 213 in order to provide phase alignment of the alternate reference signal.

The extraction logic further operates to recover an additional time reference from the frame pulse signal, specifically the synch frame or field and the alternate extraction logic further operates to recover an additional alternate time reference from the alternate frame pulse signal or synch field that is part thereof. In a preferred form up to six additional time references (6.2 second, 1 second, and 4 configurable references) and additional alternate time references are recovered. These additional time references are available for phase aligning or synchronizing local time references on the communication card to those time references from the interface 109 or data frame signal 207 for the base site as a whole. Which if any of these time references will be used depends on the particular functionality of the communications card.

The communications card will, preferably, include means 139 depicted as synch logic 261 and circular FIFO buffer 263 for providing a signal with an integral synchronization indication at base band bus 141 to facilitate communications and maintain synchronization with another communications card. The circular FIFO buffer 263 stores a sufficient portion of the base band bus signal (preferably 240 nano seconds) to insure synchronization with the other communications cards. One of the time references, specifically an 80 millisecond reference, preferably C1 (see FIG. 5 and discussion thereof) is used by the synch logic 261 and circular FIFO buffer 139 as a phase reference to provide a signal including the integral synchronization indication to another communication card and maintain synchronization or data alignment with that card whenever an anomaly is encountered.

Additionally the extraction logic 205 further recovers a reset signal 206 and the alternate extraction logic 215 further recovers an alternate reset signal 216 for use in providing a hard reset to one or more functions on the communications card. Typically this reset signal is required or useful for certain legacy equipment or functionality and will not be further discussed. The reference phase, additional time references and frame pulses recovered by the respective extraction logic 205, 215 are coupled to a time ref and frame pulse multiplexer 220 or switch.

The reference signal and alternate reference signal are coupled by the respective input dividers 203, 213 to the switch 129 or reference multiplexer and to monitors 221, 223 or clock alarm logic. The switch uses known techniques for selecting one of the reference signal and the alternate reference signal as output from the dividers to provide a selected reference signal at 224. The dividers divide the preferred 20 MHz frequency of the reference signals by a divisor that is programmed into the dividers at input 222 to a frequency in the low KHz range, for example 2 to 10 KHz depending on the requirements of the communication card.

The monitor 221 is for monitoring the reference signal from the divider 203 to provide a reference status at 227 and the alternate monitor is for monitoring the alternate reference signal from the divider 213 to provide an alternate reference status at 229. Basically the monitors verify that there respective reference signal is available and close to the proper frequency using known techniques and if not provide the status or alarm signals at 227 and 229.

The reference status and the alternate reference status are coupled, respectively, by the control logic 231, 233 to the switch and used to switchover or switch from an invalid one to a valid one of the reference signal and the alternate reference signal to continue to provide a valid version of the selected reference signal. The reference status and the alternate reference status can be coupled to the switch using either a hardware based function or a software based function. Basically the status information or derivative thereof can be coupled directly to and used to control the switch 129 and via the bus 130 couple to and used to control the switch 220 in a hardware based approach. Alternatively the status information will be coupled by the bus to a processor, either local to the board or on another board within the base station and instructions from the processor will control the switches 129 and 220 in a software based approach. As mentioned earlier the communications card and all others ordinarily operate from the reference signal and are switched over to the alternate reference signal when an anomaly is detected.

This selected reference signal at 224 is coupled to clock generator 131 as one of the inputs to a phase comparator 225. The clock generator is, preferably, a properly arranged phase locked loop that is guided or directed by the selected reference signal to provides one or more clock signals 137 or local board clock signals at frequencies corresponding to the selected reference signal, where the one or more clock signals further correspond to functions, for example a CDMA modem that requires 19.6608 MHz clocks for IS-95 CDMA and 61.44 MHz clocks for UMTS or wideband CDMA, provided by the communications card. The other input to the phase comparator 225 comes from a voltage controlled oscillator (VCO) 235 as divided down in frequency by divider 237 which is programmed or controlled at input 239. The output of VCO 235 is the local board clock or basis for such clock. Basically by selecting the divisors at dividers 203, 213 and divider 237 the frequency of the local board clock can be determined. The VCO frequency will be the frequency of the reference signal, 20 MHz, divided by the divisor of divider 203 or the frequency of the selected reference signal at 224 multiplied by the divisor of divider 237 as is known.

The clock signal 137 is also coupled to dividers 241, 243, 245, and 247 which divide the clock signal to provide at there, respective, outputs time ref 1 242, time ref 2 244, time ref 3 246, and time ref 4 248 signals. These are the same time references or 4 of the 6 possible that were recovered by the extraction logic, now translated to the local board clock, but still synchronized to the recovered time references. The audit and alignment functions 249 operate in a similar fashion to monitor and divider reset functions discussed above to drive the dividers to a known value at the proper time as determined by the logic, shown generally by 251. The logic operates using the frame pulses and local clock 137 to clock the additional time references from switch 220 through the logic according to the clock signal thus synchronizing these references generated from the clock signal to the recovered time references.

FIG. 3 illustrates in a representative form a portion of a preferred embodiment of the reference signal 121 as used in the FIG. 1 system. More specifically the reference waveform 201 and data frame pulse signal 207 are depicted together with a receive data signal 301. As mentioned above the reference signal 201 is a 20 MHz waveform that is supplied by the clock source 101 or reference generation unit 115. The data frame pulse signal is alternating bits of data 303 and frame pulses 305 with the frame pulses being valid on the falling edge 307 of the reference signal and the data being valid on the rising edges 309. The information shown as data bits can either be data or it can be synch bits. If the frame pulse is high the following bit will be data and if this pulse is low the following bit is a synch bit. The receive data bit rate of receive data signal 301 is at half the bit rate of the data frame pulse bit rate. Note that typically only legacy equipment that utilizes circuit switched data will include transmit data with the data frame pulse signal or the receive data signal. Sequential bits of the data stream or the synch bit stream are organized into fields or frames as shown in FIG. 4 and FIG. 5, respectively.

As an overview the data frame pulse signal is parsed into frames or super frames which occur at an 8 KHz rate or once each 125 micro seconds or 2500 frame pulse bits and 2500 data bits. These frames are comprised of 138 18 bit data fields or frames and one 16 bit synch field or frame which are clocked out at the 20 MHz rate. The data being transferred is preferably circuit switched data that is made available from a carrier or service provider at a network clock rate up to 16.384 MHz. This yields 2048 bits of data clocked in at the 16.384 MHz network rate to be clocked out at the 20 MHz clock or reference rate of the signal 201.

FIG. 4 demonstrates data field 400 and data field or frame bit assignments in the FIG. 3 data frame pulse signal. The P or present bit 401 indicates whether data in this data field is valid; valid if a "1" and invalid if a "0" indicating no data. When the P bit is set to "0" the network frame pulse bit, NFP 403 is set to "1" and the data bits D0–D15 405 are set to Hex 00FF. On average, when network data is present at the 16.384 MHz rate, 128 data fields will contain the 2048 bits of data (128×16=2048) and 10 data fields will thus be empty. The NFP bit, when set to "0", indicates the beginning of the next network data frame or super frame based on the network clock rate. Since the network clock rate and the reference signal clock rate vary the NFP bit will float within the 125 micro second frame or super frame. When present as indicted by the P bit the 16 bits of data D0–D15 are sent with D0 being first and D15 being the last bit sent.

Figure 7:
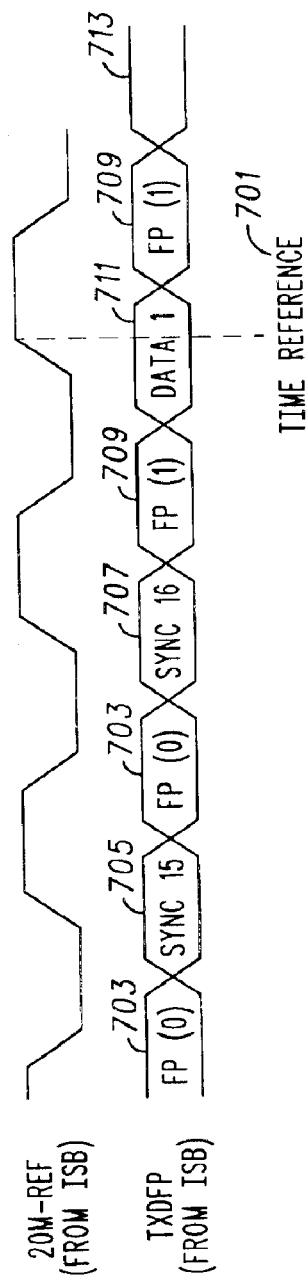
FIG. 7 shows a phase reference in a portion of the FIG. 3 signal.

The synch field 500 or frame is at the beginning of each 125 micro second frame or super frame. FIG. 5 demonstrates sync field or frame bit assignments in the FIG. 3 data frame pulse signal. The first synch field bit occurs or is available after the first frame pulse that is set to "0". The following additional 15 frame pulses will also be set to "0" and the remaining 15 bits of the synch field are provided. The first seven bits F0–F6 501 are presently reserved for future use and set to "1". The C0–C3 503, bits 8–11 are configurable bits that may be used as additional time references where they indicate an additional time reference that is a multiple of 125 microseconds. Allowable values range from 250 microseconds up to 32.768 seconds. A "0" in any of these bits C0–C3 indicates that the rising edge of the 20 MHz clock or reference signal following the next low to high transition of the frame pulse (beginning of the next 125 micro second frame or super frame) is the frame pulse assigned to that time reference, preferably, by software as shown in FIG. 7. The 6S 505 and 1S 507 bits are additional time references designating, respectively, a 6.12 second and a 1 second reference. A "0" in these bit locations indicates that the rising edge of the clock signal after the next low to high transition of the frame pulse (beginning of the next 125 microsecond frame) is the respective time reference tick 701 or pulse frame. The R+ and R– bits 509 indicate when a reset is requested. When R+ is set to "1" and R– is set to "0" a reset is requested and when R+ is set to "0" and R– is set to "1" no reset is indicated. The $16^{th}$ bit is always set to "0". Note that since the signals such as 121, 123, 125, 127, etc are point to point connections from the reference signal sources to the various communications cards, bits in the synch field, such as C0–C3 503 and R+ and R– 509 can take different values for different links thus, for example, resetting one communications card and not another.

Figure 6:
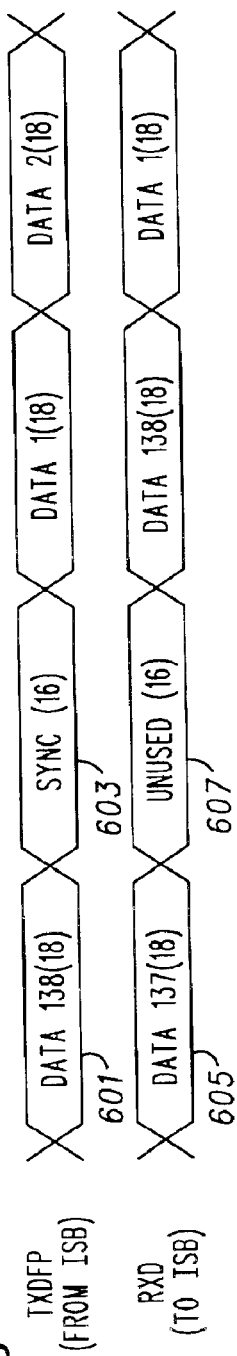
FIG. 6 depicts an overview of the data and sync fields in the FIG. 3 signal.

FIG. 6 depicts an overview of a portion of the data and sync fields in the FIG. 3 data frame signal 207 and receive data signal 301. As indicated the $138^{th}$ 18 bit data field 601 (completing one 125 microsecond frame or super frame) is followed by the 16 bit synch field 603 (signifying the start of the next 125 microsecond frame or super frame) and thereafter by data fields 1–138 on the transmit link or path. The receive data as sent from the communications card to the ISB lags the transmit data by one data field. Specifically the $137^{th}$ field 605 of 18 bits is being sent to the ISB at the same time the $138^{th}$ transmit data field is being sent from the ISB to the communications card. The 16 bit field 607 corresponding to the synch field 603 is unused and is set to a Hex value of AAAA.

FIG. 7 shows the time reference 107 or phase reference noted above in a portion of the FIG. 3 signal. Specifically the frame pulse bits 703 are shown as "0" indicating that the following bits are synch bits, specifically synch 15 705 and synch 16 707. Thereafter the frame pulse bits 709 are set to "1" indicating the start of the next 125 microsecond frame or super frame and that the bits following these frame pulses are data bits, specifically the first and second data bit 711, 713 of the 1st data field with the time or phase reference 701 or tick being the rising edge of the 20 MHz reference clock following the first positive frame pulse as above discussed. Note this time reference or phase reference occurs at a rate of 8000 times per second and the status of the bits C0–C3, 6S and 1S determine whether the phase reference is also a time reference corresponding to the 6.12 second, or 1 second or other configurable time references.

The above detailed discussions of the FIG. 1 redundant clock or reference signal system and interface and the FIG. 2 communications card or resource or payload for using a redundant reference signal from the interface 109 as well as the detailed discussion of the preferred reference signal in FIG. 3–FIG. 7 and the concepts and principles involved therein will now be reviewed. What has been shown is an interface arranged and constructed to interface with a communications card and provide a redundant reference clock. The interface includes means for sending a reference signal to the communications card or resource, the reference signal suitable for controlling a local clock on the communications card and means for sending an alternate reference signal to the communications card, the alternate reference signal suitable for controlling the local clock; and means for controlling a switch, coupled to the reference signal and the alternate reference signal, for selecting one of the reference signal and the alternate reference signal to provide a selected reference signal for controlling the clock.

The interface further, preferably includes means for sending a frame pulse signal corresponding to the reference signal to the communications card and means for sending an alternate frame pulse signal corresponding to the alternate reference signal to the communications card, the frame pulse signal and the alternate frame pulse signal suitable for maintaining phase alignment of the reference signal and the alternate reference signal with, respectively, the frame pulse signal and the alternate frame pulse signal. The frame pulse signal, preferably, includes a reference phase to provide the phase alignment of the reference signal and the alternate frame pulse signal, preferably, includes an alternate reference phase to provide the phase alignment of the alternate reference signal.

The frame pulse signal, preferably, further includes one or more additional time references and the alternate frame pulse signal, preferably, includes one or more additional alternate time references, each of the additional time references and the additional alternate time references suitable for phase aligning a local time reference for the communication card. The frame pulse signal also, preferably, includes a reset signal and the alternate frame pulse signal further includes an alternate reset signal, the reset signal and the alternate reset signal suitable for use in providing a hard reset to one or more functions on the communications card.

In one embodiment where the communications cards or resources are handling circuit switched data the frame pulse signal and the alternate frame pulse signal are intermixed, respectively, with data and alternate data to provide a data frame signal and an alternate data frame signal. The data frame signal and the alternate data frame signal include data frames or fields at a first frame or field rate, specifically 1.104 Mega frames per second and synch frames at a second frame rate, specifically 8,000 frames or fields per second. The synch frames include one or more of a phase reference, a reset signal, and a plurality of time reference signals.

Continuing our review and looking at the cards, boards, or payloads that are arranged to couple to the above discussed interface we have disclosed a communications resource or card that is arranged to operate with a redundant reference signal to provide communication services. The resource includes means for receiving a first reference signal and a second reference signal and means for determining whether the first reference signal and the second reference signal are valid and selecting a valid one of the first reference signal and the second reference signal to provide a selected reference signal. The resource or card further includes a clock generator, coupled to and controlled or steered by the selected reference signal, for generating a clock signal for use by the communication resource.

The communications resource further includes means for receiving a first frame pulse signal corresponding to the first reference signal and means for receiving a second frame pulse signal corresponding to the second reference signal, where the first frame pulse signal and the second frame pulse signal are suitable for maintaining phase alignment of the first reference signal and the second reference signal with, respectively, the first frame pulse signal and the second frame pulse signal. In one embodiment the first frame pulse signal and the second frame pulse signals are intermixed, respectively, with first data and second data to provide a first data frame signal and a second data frame signal. Note that while our discussions have concerned a reference signal and a second or alternate reference signal the same principles apply with a multiplicity of reference signals. As earlier noted with the above discussed inventive approach to providing a redundant clock system the individual communications cards or resources have greater independence from the clock than in prior art systems and can independently switch reference sources and independently utilize reference sources and still maintain synchronization so as to allow for interoperating between cards.

The processes, discussed above, and the inventive principles thereof are intended to and will alleviate problems caused by prior art redundant clock systems such as transient pulses during switchover or the problems with trying to accomplish diverse tasks for diverse system technologies with identical clocks. One of the principles used is relying upon the system reference signal to direct the local clock rather than as a local clock thus isolating the system clock from the local board clock. Another is combining various data with various reference information in a data frame pulse signal that in a since includes additional redundancy for the reference signal. This dramatically reduces the number of connections required and in a point to point or hub to resource architecture makes the interconnect scheme much more practical.

Various embodiments of methods, systems, and apparatus for providing, interfacing to and utilizing a redundant reference system so as to facilitate and provide for a redundant clock system in a point to point architecture in an efficient and practical manner have been discussed and described. It is expected that these embodiments or others in accordance with the present invention will have application to various equipment installed to provide wide area networks (WAN) such as wireless WANs or the PSTN or Internet. The disclosure extends to the constituent elements or equipment comprising such systems and specifically the methods employed thereby and therein. Using the inventive principles and concepts disclosed herein advantageously allows or provides for low latency and low overhead redundant clock systems and procedures for maintaining and switching among such redundant clocks that will improve service availability which will be beneficial to users and providers a like.

This disclosure is intended to explain how to fashion and use various embodiments in accordance with the invention rather than to limit the true, intended, and fair scope and spirit thereof. The invention is defined solely by the appended claims, as may be amended during the pendency of this application for patent, and all equivalents thereof.

What is claimed is:

1. A communications card arranged and constructed to use a redundant reference clock system, the communications card comprising in combination:

means for coupling to a reference signal;

means for coupling to an alternate reference signal, the reference signal and alternate reference signal being redundant;

a switch, coupled to said reference signal and said alternate reference signal, for selecting, responsive to locally generated reference signal status information, one of said reference signal and said alternate reference signal to provide a selected reference signal, and a clock generator, coupled to said selected reference signal, for providing one or more clock signals at frequencies corresponding to said selected reference signal, said one or more clock signals further corresponding to functions provided by the communications card.

2. The communications card of claim 1 further including a monitor, coupled to said reference signal, for monitoring said reference signal to provide a reference status and an alternate monitor, coupled to said alternate reference signal, for monitoring said alternate reference signal to provide an alternate reference status.

3. The communications card of claim 2 wherein said reference status and said alternate reference status are coupled to said switch and used to switchover from an invalid one to a valid one of said reference signal and said alternate reference signal to continue to provide said selected reference signal.

4. The communications card of claim 3 wherein said reference status and said alternate reference status are coupled to said switch using one of a hardware based function and a software based function.

5. The communications card of claim 1 further including means for coupling to a frame pulse signal corresponding to said reference signal and means for coupling to an alternate frame pulse signal corresponding to said alternate reference signal, said frame pulse signal and said alternate frame pulse signal suitable for maintaining phase alignment of said reference signal and said alternate reference signal with, respectively, said frame pulse signal and said alternate frame pulse signal.

6. The communications card of claim 5 further including extraction logic for recovering a reference phase from said frame pulse signal to provide said phase alignment of said reference signal and further including alternate extraction logic for recovering an alternate reference phase from said alternate frame pulse signal to provide said phase alignment of said alternate reference signal, thereby maintaining synchronization of said clock signals with, respectively, said reference signal and said alternate reference signal.

7. The communications card of claim 6 wherein said extraction logic further operates to recover an additional time reference from said frame pulse signal and said alternate extraction logic further operates to recover an additional alternate time reference from said alternate frame pulse signal, one of said additional time reference and said additional alternate time reference for phase aligning a local time reference far the communication card.

8. The communications card of claim 6 wherein said extraction logic further recovers a reset signal and said alternate extraction logic further recovers an alternate reset signal for use in providing a hard reset to one or more functions on the communications card.

9. The communications card of claim 5 wherein the frame pulse signal and alternate frame pulse signals are intermixed, respectively, with data and alternate data.

10. The communications card of claim 1 wherein said clock generator further includes a phase locked loop that is arranged to provide said clock signals.

11. The communications card of claim 1 further including means for providing a signal with an integral synchronization indication to facilitate communications with another communications card.

12. The communications card of claim 11 further including a buffer for storing a sufficient portion of said signal to insure synchronization with said another communications card.

13. An interface arranged and constructed to interface with a communications card and provide a redundant reference clock, the interface comprising in combination:

means for sending a reference signal and a corresponding frame pulse signal intermixed with data to the communications card, said reference signal suitable for controlling a local clock on the communications card;

means for sending an alternate reference signal and an alternate frame pulse signal intermixed with alternate data to the communications card, said alternate reference signal suitable for controlling said local clock, the reference signal and the alternate reference signal being redundant; and means for controlling a switch, coupled to said reference signal and said alternate reference signal, for selecting one of said reference signal and said alternate reference signal to provide a selected reference signal for controlling said local clock.

14. The interface of claim 13 wherein said frame pulse signal and said alternate frame pulse signal are suitable for maintaining phase alignment of said reference signal and said alternate reference signal with, respectively, said frame pulse signal and said alternate frame pulse signal.

15. The interface of claim 14 wherein said frame pulse signal includes a reference phase to provide said phase alignment of said reference signal and said alternate frame pulse signal includes an alternate reference phase to provide said phase alignment of said alternate reference signal to thereby maintain synchronization of said local clock with, respectively, said reference signal and said alternate reference signal.

16. The interface of claim 14 wherein said flame pulse signal further includes an additional time reference and said alternate frame pulse signal further includes an additional alternate time reference, each of said additional time reference and said additional alternate time reference suitable for phase aligning a local time reference for the communication card.

17. The interface of claim 14 wherein said frame pulse signal further includes a reset signal and said alternate frame pulse signal further includes an alternate reset signal, said reset signal and said alternate reset signal suitable for use in providing a hard reset to one or more functions on the communications card.

18. The interface of claim 14 wherein said frame pulse signal and said alternate frame pulse signals intermixed, respectively, with said data and said alternate data provide, respectively, a data frame signal and an alternate data frame signal.

19. The interface of claim 18 wherein said data frame signal and said alternate data frame signal include data frames at a first frame rate and synch frames at a second frame rate.

20. The interface of claim 19 wherein said synch frames include one of a phase reference, a reset signal, and a time reference signal.

21. A redundant clock system for use in communications equipment, the clock system comprising in combination:
a clock source for providing a reference signal for a plurality of communication cards;
an alternate clock source, coupled to said clock source, for providing a redundant reference signal for said plurality of communication cards;
each of said plurality of said communication cards coupled to said reference signal and said redundant reference signal and a respective corresponding frame pulse signal intermixed with data,
said each of said plurality of said communication cards including a clock generator, selectively referenced to one of said reference signal and said redundant reference signal, for providing one or more clock signals at frequencies corresponding to functions provided by said each of said plurality of said communications cards, and
said each of said plurality of said communication cards arranged to couple to a surviving one of said reference signal and said redundant reference signal when a failure of said one of said reference signal and said redundant reference signal is detected.

22. A communications resource arranged to operate with a redundant reference signal to provide communication services, the resource comprising in combination:
means for receiving a first reference signal and a second reference signal, said second reference signal being a redundant reference signal;
means, coupled to each of said first and said second reference signal, for locally determining whether said first reference signal and said second reference signal are valid and selecting a valid one of said first reference signal and said second reference signal to provide a selected reference signal; and
a clock generator, coupled to and controlled by said selected reference signal, for generating a clock signal for use by the communication resource.

23. The communications resource of claim 22 further including means for receiving a first frame pulse signal corresponding to said first reference signal and means for receiving a second frame pulse signal corresponding to said second reference signal, said first frame pulse signal and said second frame pulse signal suitable for maintaining phase alignment of said first reference signal and said second reference signal with, respectively, said first frame pulse signal and said second, frame pulse signal, thereby maintaining synchronization of said clock signal with, respectively, said first reference signal and said second reference signal.

24. The communications resource of claim 23 wherein said first frame pulse signal and said second frame pulse signals are intermixed, respectively, with first data and second data to provide a first data frame signal and a second data frame signal.

25. The communications resource of claim 24 wherein said first data frame signal and said second data frame signal include data frames at a first frame rate and synch frames at a second frame rate.

26. The communications resource of claim 25 wherein said synch frames include one of a phase reference, a reset signal, and a time reference signal for use by the communications resource.

* * * * *